United States Patent
Kanaya

(10) Patent No.: US 10,115,891 B2
(45) Date of Patent: Oct. 30, 2018

(54) MAGNETORESISTIVE MEMORY DEVICE AND MANUFACTURING METHOD OF THE SAME

(71) Applicant: TOSHIBA MEMORY CORPORATION, Minato-ku, Tokyo (JP)

(72) Inventor: Hiroyuki Kanaya, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/066,810

(22) Filed: Mar. 10, 2016

(65) Prior Publication Data

US 2016/0308115 A1 Oct. 20, 2016

Related U.S. Application Data

(60) Provisional application No. 62/148,323, filed on Apr. 16, 2015.

(51) Int. Cl.
*H01L 33/62* (2010.01)
*H01L 43/12* (2006.01)
*H01L 43/08* (2006.01)
*H01L 43/10* (2006.01)
*H01L 27/22* (2006.01)

(52) U.S. Cl.
CPC ............ *H01L 43/12* (2013.01); *H01L 27/228* (2013.01); *H01L 43/08* (2013.01); *H01L 43/10* (2013.01)

(58) Field of Classification Search
CPC ....... H01L 43/08; H01L 43/12; H01L 27/228; H01L 43/02; H01L 43/10; H01L 21/76834; H01L 21/76841; H01L 21/76843; H01L 23/528; H01L 27/105; H01L 27/222; H01L 27/226; H01L 27/3258; H01L 27/3262
USPC ...... 438/3; 257/421, E43.006, 427, E21.001, 257/E21.002, E21.584, E27.005, E29.323, 257/E43.004, 252, 30, 4
See application file for complete search history.

(56) References Cited

U.S. PATENT DOCUMENTS

| | | | |
|---|---|---|---|
| 2005/0110004 A1* | 5/2005 | Parkin | B82Y 25/00 257/30 |
| 2006/0088947 A1* | 4/2006 | Lien | H01L 21/76834 438/3 |
| 2009/0130779 A1* | 5/2009 | Li | H01L 43/12 438/3 |
| 2009/0305147 A1* | 12/2009 | Constancias | G03F 1/24 430/5 |
| 2012/0187456 A1* | 7/2012 | Nomachi | G11C 11/16 257/252 |

(Continued)

FOREIGN PATENT DOCUMENTS

JP 2013201343 A 10/2013

*Primary Examiner* — Edward Chin
(74) *Attorney, Agent, or Firm* — Holtz, Holtz & Volek PC

(57) ABSTRACT

According to one embodiment, a magnetoresistive memory device includes bottom electrodes provided on a substrate, a magnetoresistive element provided on each of the bottom electrodes, a top electrode provided on each of the magnetoresistive elements, an insulating film provided on sides of the bottom electrode, the magnetoresistive element and, the top electrode, and a magnetic layer provided on the top electrode, the magnetic layer extending on the insulating film to connect a plurality of those of the top electrodes.

14 Claims, 10 Drawing Sheets

(56) References Cited

U.S. PATENT DOCUMENTS

| | | | |
|---|---|---|---|
| 2013/0069186 A1* | 3/2013 | Toko | H01L 43/08 257/425 |
| 2013/0240964 A1 | 9/2013 | Ozeki et al. | |
| 2013/0249028 A1* | 9/2013 | Kamata | H01L 43/08 257/427 |
| 2014/0077319 A1 | 3/2014 | Noma et al. | |
| 2014/0203381 A1* | 7/2014 | Zhu | H01L 43/12 257/421 |
| 2015/0255706 A1* | 9/2015 | Iwayama | H01L 43/08 257/421 |
| 2015/0325622 A1* | 11/2015 | Zhang | H01L 43/12 257/421 |
| 2016/0233333 A1* | 8/2016 | Toh | H01L 43/12 |
| 2016/0308115 A1* | 10/2016 | Kanaya | H01L 27/228 |
| 2016/0322421 A1* | 11/2016 | Ito | H01L 27/228 |
| 2016/0380029 A1* | 12/2016 | Hase | G11C 11/1673 257/4 |
| 2017/0047375 A1* | 2/2017 | Kanaya | H01L 27/228 |
| 2017/0062520 A1* | 3/2017 | Sato | H01L 43/02 |
| 2017/0062705 A1* | 3/2017 | Yamakawa | H01L 43/08 |
| 2017/0069835 A1* | 3/2017 | Sonoda | H01L 43/12 |
| 2017/0077200 A1* | 3/2017 | Mou | H01L 51/5076 |

\* cited by examiner

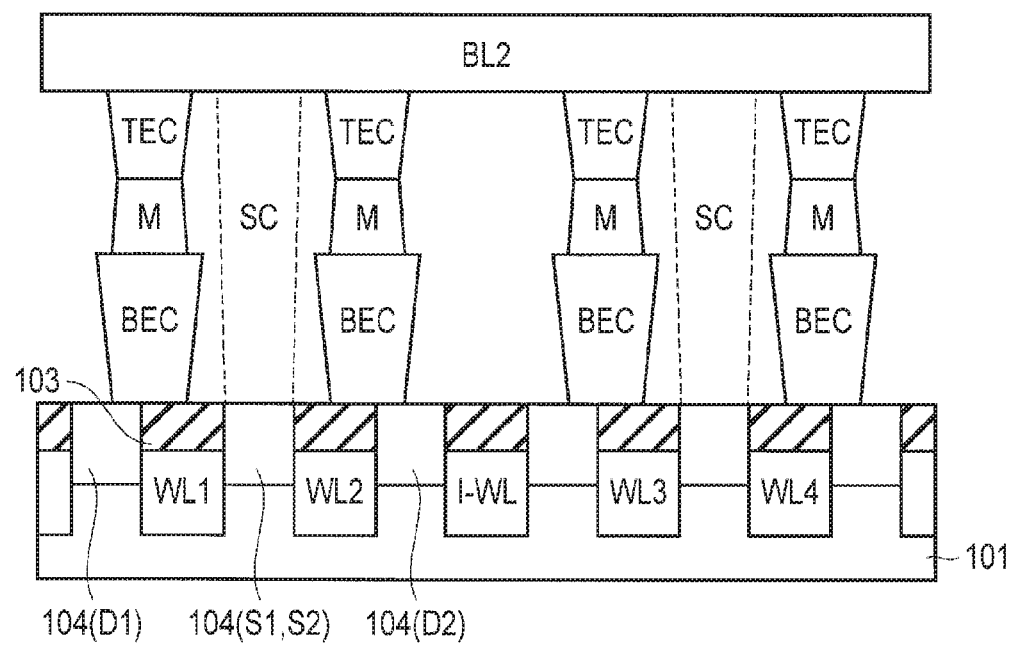
F I G. 2
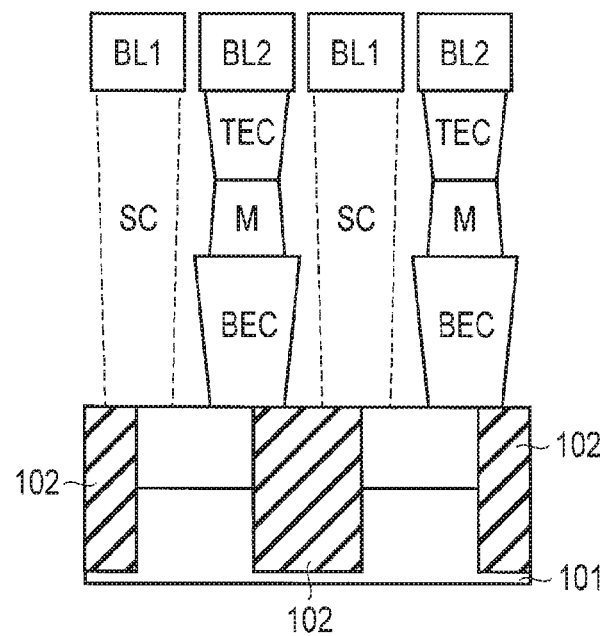
F I G. 3

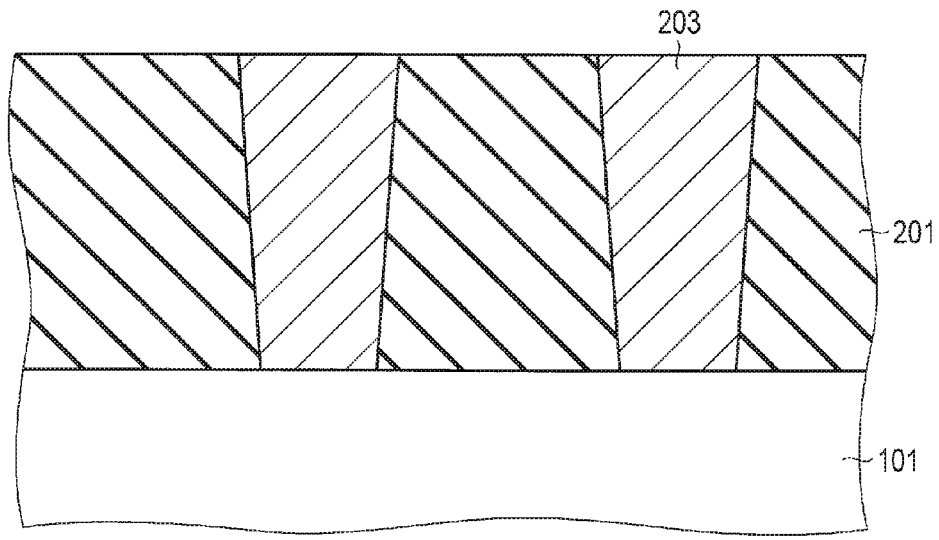
F I G. 5A
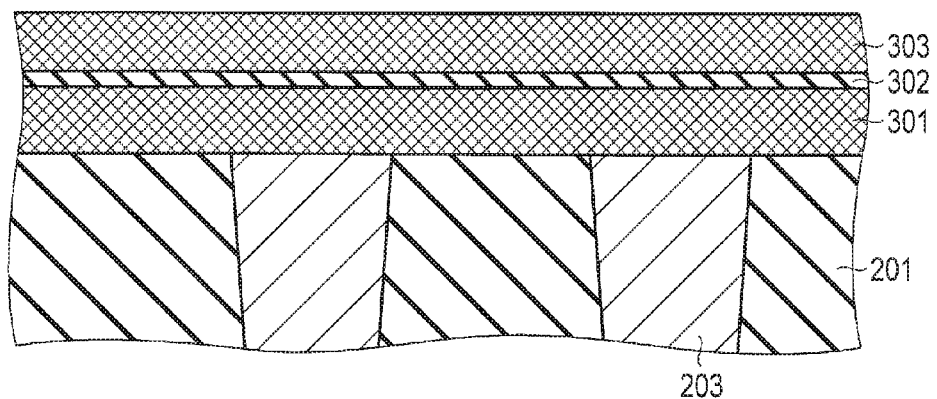
F I G. 5B

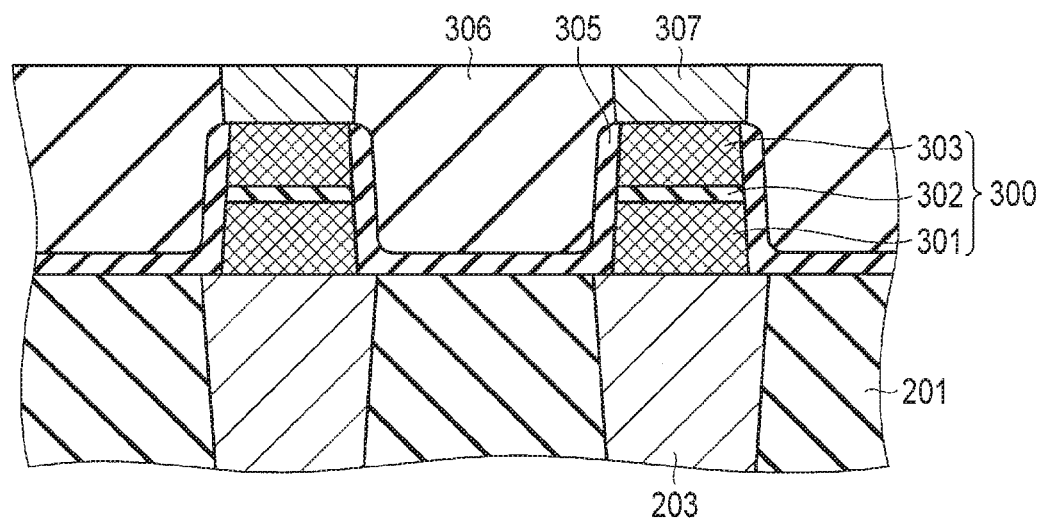
F I G. 5E
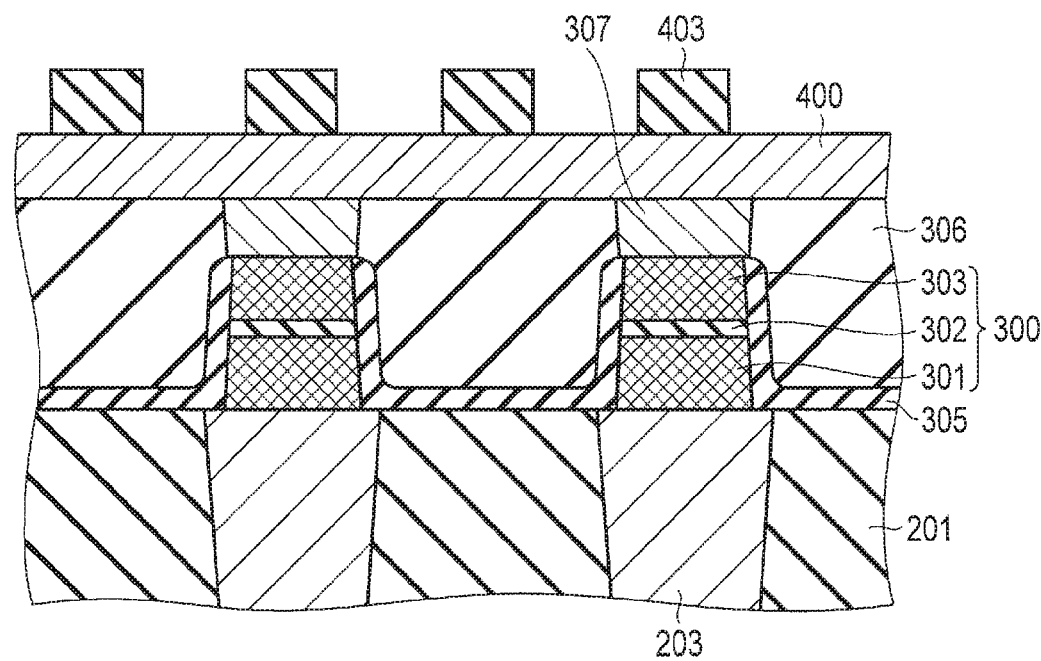
F I G. 5F

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/148,323, filed Apr. 16, 2015, the entire contents of which are incorporated herein by reference.

FIELD

Embodiments described herein relate generally to a magnetoresistive memory device and a manufacturing method of the same.

BACKGROUND

Recently, large-capacity magnetoresistive random access memories (MRAM) using a magnetic tunnel junction (MTJ) element have been gaining attention and raising expectations. The MTJ element comprises the following two magnetic layers sandwiching a tunnel barrier layer: a magnetization fixed layer (reference layer) having a fixed direction of magnetization and a magnetization free layer (storage layer) having an easily reversible direction of magnetization. Further, there is a case where the MTJ element further comprises a shift-adjustment layer to suppress the influence of a stray magnetic field from the reference layer.

When the MTJ element is miniaturized, it is necessary to increase the thickness of the shift-adjustment layer. However, if the MTJ element comprises a thick shift-adjustment layer, processing of the MTJ element, such as ion beam etching (IRE), is difficult.

BRIEF DESCRIPTION OF THE DRAWINGS

FIG. 2 is a cross-sectional view taken along line I-I' of FIG. 1.

FIG. 3 is a cross-sectional view taken along line II-II' of FIG. 1.

FIGS. 5A to 5F are cross-sectional diagrams showing steps of manufacturing the magnetoresistive memory device of FIG. 1.

DETAILED DESCRIPTION

In general, according to one embodiment, a magnetoresistive memory device comprises: a plurality of bottom electrodes provided on a substrate; a magnetoresistive element provided on each of the bottom electrodes; a top electrode provided on each of the magnetoresistive elements; an insulating film provided on sides of the bottom electrode, the magnetoresistive element and the top electrode; and a magnetic layer provided on the top electrode, the magnetic layer extending on the insulating film to connect a plurality of those of the top electrodes.

Magnetoresistive memory devices of the present embodiments will be described hereinafter with reference to the accompanying drawings.

First Embodiment

Figure 1:
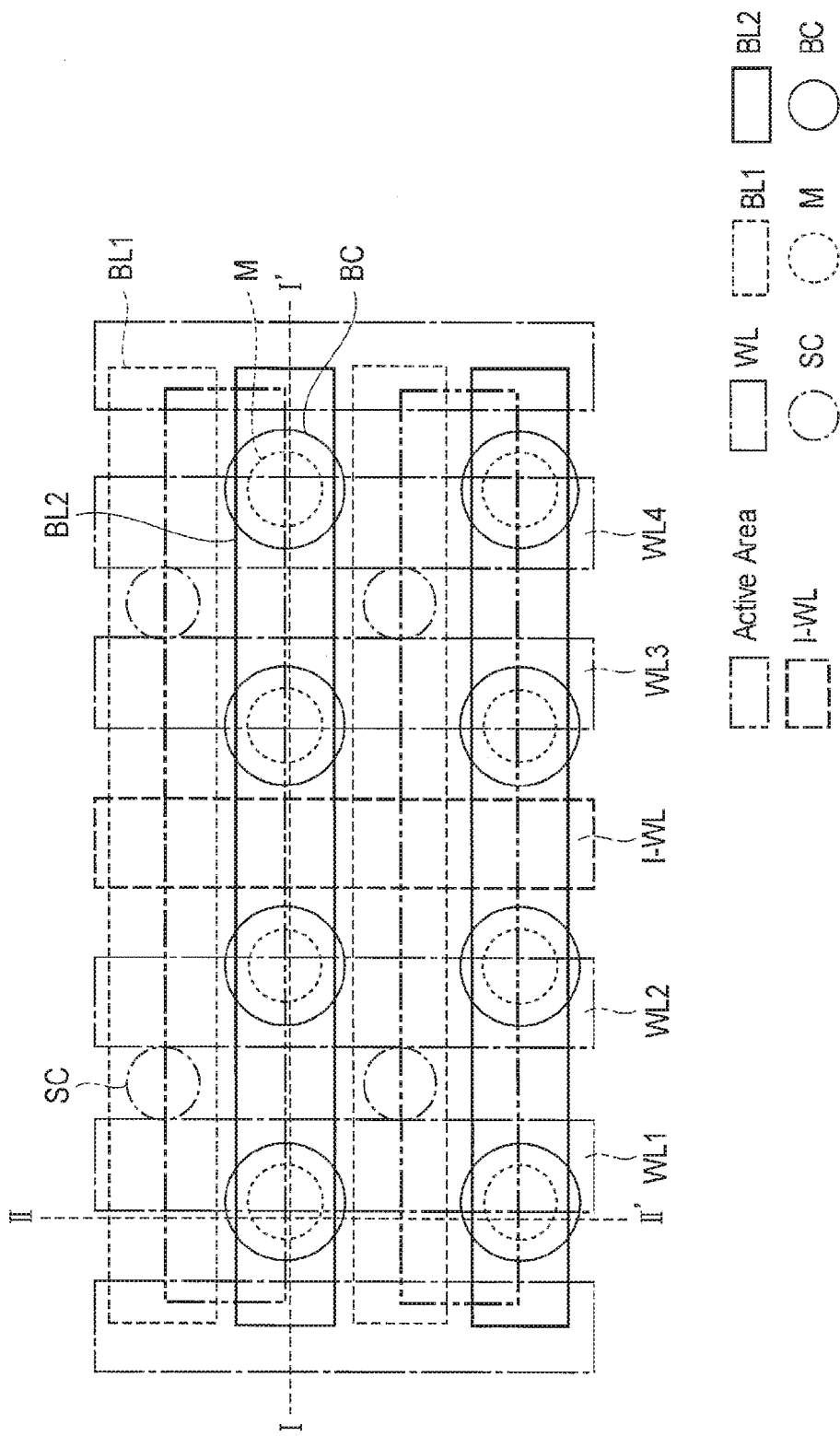
FIG. 1 is an exemplary plan view of a magnetoresistive memory device of a first embodiment.

FIG. 1 is an exemplary plan view of a magnetoresistive memory device of a first embodiment. FIG. 2 is a cross-sectional view taken along line I-I' of FIG. 1, and FIG. 3 is a cross-sectional view taken along line II-II' of FIG. 1. The member shown by dashed lines in FIGS. 2 and 3 is a plug SC which is provided at the back and thus cannot be seen in the cross-sections of line I-I' and line II-II'.

The magnetoresistive memory device of the present embodiment is an MRAM comprising a spin-transfer-torque writing type MTJ element (magnetoresistive element) as a storage element. As the MTJ element, a perpendicular magnetization film is used. The perpendicular magnetization film is a magnetic film having a direction of magnetization (direction of an axis of easy magnetization) substantially perpendicular to the film surface of the perpendicular magnetization film.

In the drawings, the member denoted by the reference number 101 is a silicon substrate (semiconductor substrate), and on the surface of the silicon substrate 101, an element isolation region 102 is formed. The element isolation region 102 defines an active region.

The MRAM of the present embodiment comprises: a first select transistor the gate electrode of which is a word line WL1; a first MTJ element M connected to one source/drain region 104 (drain region D1) of the first select transistor; a second select transistor the gate of which is a word line WL2; and a second MTJ element M connected to one source/drain region 104 (drain region D2) of the second select transistor. In the drawings, the member denoted by the reference number 103 is a cap insulating film. That is, one memory cell of the present embodiment comprises one MTJ (storage element) and one select transistor, and two select transistors of two memory cells adjacent to each other share the other source/drawn region 104 (source region S1, S2).

The gate (gate insulating film, gate electrode) of the select transistor of the present embodiment is buried in the surface of the silicon substrate 101. That is, the gate of the select transistor has a buried-gate (BG) structure. Further, the gate for element isolation (word line I-WL) has the BC structure as well.

One source/drain region 104 (D1) of the first select transistor is connected to the bottom part of the first MTJ element M via a bottom electrode REC. The top part of the first MTJ element M is connected to a bit line BL2 via a top electrode TEC.

The other source/drain region 104 (S1) of the first select transistor is connected to a bit line BL1 via the plug SC.

In the present embodiment, the planar patterns of the bottom electrode BEC, the MTJ element M, the top electrode TEC and the plug SC are assumed to be circular but may be in a different shape.

One source/drain region 104 (D2) of the second select transistor is connected to the bottom part of the second MTJ element M via the bottom electrode BEC. The top part of the second MTJ element M is connected to bit line BL2 via the top electrode TEC.

The other source/drain region 104 (S2) of the second select transistor is connected to bit line BL1 via the plug SC.

The first select transistor, the first MTJ element M, the second transistor and the second MTJ element M (two memory cells) are provided for each active region. Two adjacent active regions are separated from each other by the element isolation region 102.

Word lines WL3 and WL4 correspond respectively to the word lines WL1 and WL2. Consequently, the first select transistor the gate of which is the word line WL3, the first MTJ element M connected to one source/drain region of the first select transistor, the second transistor the gate of which is the word line WL4, and the second MTJ element M connected to one source/drain region of the second select transistor constitute two memory cells.

Figure 4:
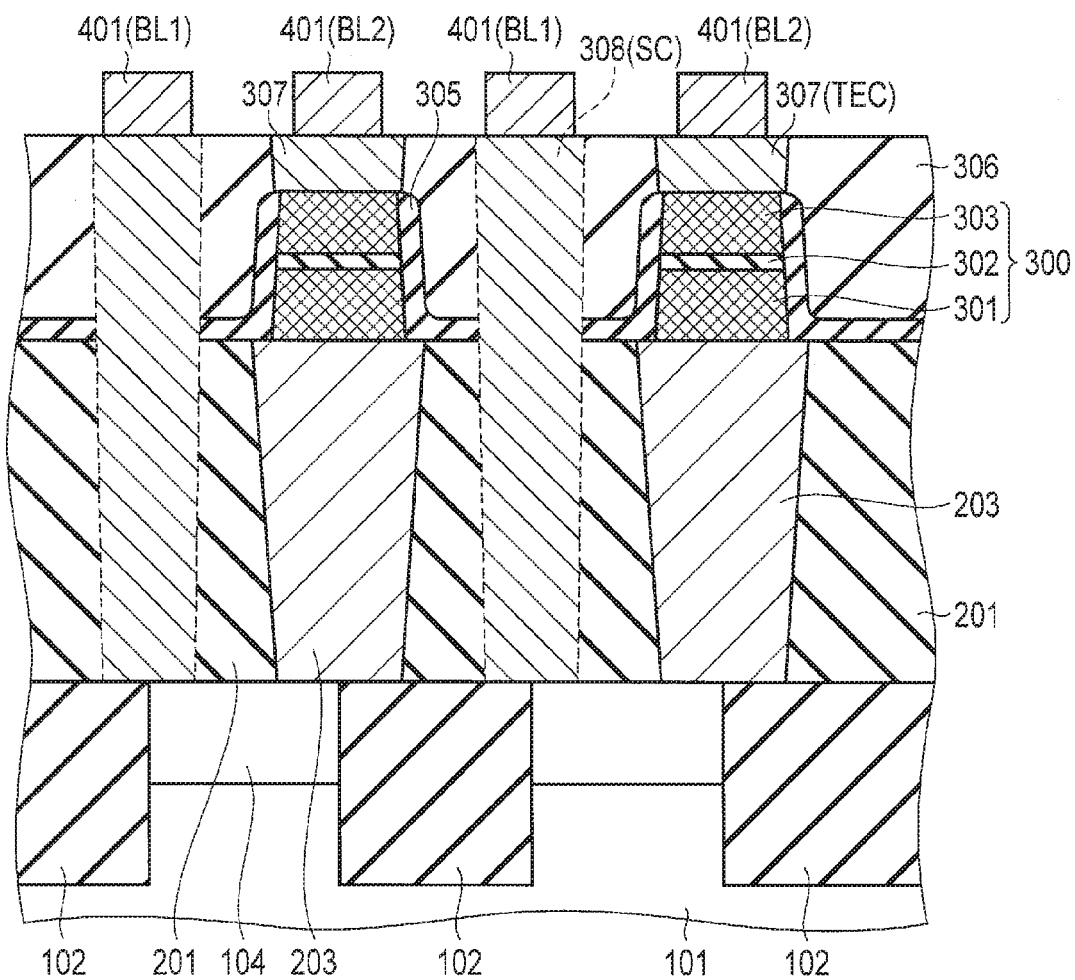
FIG. 4 is a detail cross-sectional view of FIG. 3.

FIG. 4 is a detail cross-sectional view of FIG. 3. On the silicon substrate 101 provided with the element isolation region 102, an interlayer insulating film (first insulating film) 201 is formed. In the interlayer insulating film 201, a bottom electrode 203 formed of Ta or the like is buried.

On the bottom electrode 203, an MTJ element 300 comprising a first magnetic layer 301 as a storage layer, a tunnel barrier layer 302, a second magnetic layer 303 as a reference layer is formed. The MTJ element 300 has a thickness of, for example, 35 nm. A silicon nitride film 305 is formed on the side surfaces of the MTJ element 300 and on the insulating film 201.

Here, for the storage layer 301, cobalt iron boron (CoFeB) or iron boride (FeB) can be used. For the tunnel barrier layer 302, magnesium oxide (MgO) can be used. For the reference layer 303, cobalt platinum (CoPt), cobalt nickel (CoNi) or cobalt palladium (CoPd) can be used.

A top electrode 307 is formed on the magnetic layer 303 of the MTJ element 300. Then, an interlayer insulating film (second insulating film) 306 is provided on the sides of the top electrode 307 and the silicon nitride film 305.

On the top electrode 307, a shift-adjustment layer (magnetic layer) 401 is formed to obtain a shift-cancellation effect. The shift-adjustment layer 401 extends or the interlayer insulating film 306 to connect a plurality of those of the top electrodes 307. With this structure, the shift-adjustment layer 401 is able to exhibit the shift-cancellation effect and also to function as a bit line BL.

The shift-adjustment layer 401 has an artificial lattice of, for example, alternately laminated Co and Pt and has a function of suppressing and adjusting the shift of the inversion current of the storage layer 301 caused by the stray magnetic field from the reference layer 303. In a case where the MTJ element 300 has a thickness of 35 nm, the shift-adjustment layer 401 may have a thickness of 20 nm or more. If the MTJ element 30 is further miniaturized, it is necessary to further increase the thickness of the shift-adjustment layer 401.

Now, the magnetoresistive memory device of the present embodiment will be described while following its manufacturing method. FIGS. 5A to 5F are cross-sectional diagrams showing the steps of manufacturing the magnetoresistive memory device of the present embodiment and corresponding to the cross-section taken along line II-II' of FIG. 1 described above.

First, as shown in FIG. 5A, the above-described element isolation region and select element (not shown) are formed in the silicon substrate 101. On the silicon substrate 101, the interlayer insulating film (first insulating film) 201 made of an oxide-based insulating film is formed. Then, the bottom electrode 203 is buried in the interlayer insulating film 201 by a well-known damascene process. The interlayer insulating film 201 is, for example, an $SiO_2$ film and formed by a CVD process. The bottom electrode 203 is made of a material such as tantalum (Ta), tantalum nitride (TaN), titanium (Ti), titanium nitride (TiN), copper (Cu), tungsten (N) or ruthenium (Ru).

Next, as shown in FIG. 5B, on the interlayer insulating film 201 and the bottom electrode 203, the first magnetic layer 301 as a storage layer, the tunnel barrier layer 302, the second magnetic layer 303 as a reference layer are laminated in this order by using a sputtering process. Here, since the bottom electrode 203 has a flat upper surface, the layers 301 to 303 of excellent quality are formed on the upper surface of the bottom electrode 203. For example, an excellent MgO layer is formed as the tunnel barrier layer 302.

Figure 5C:
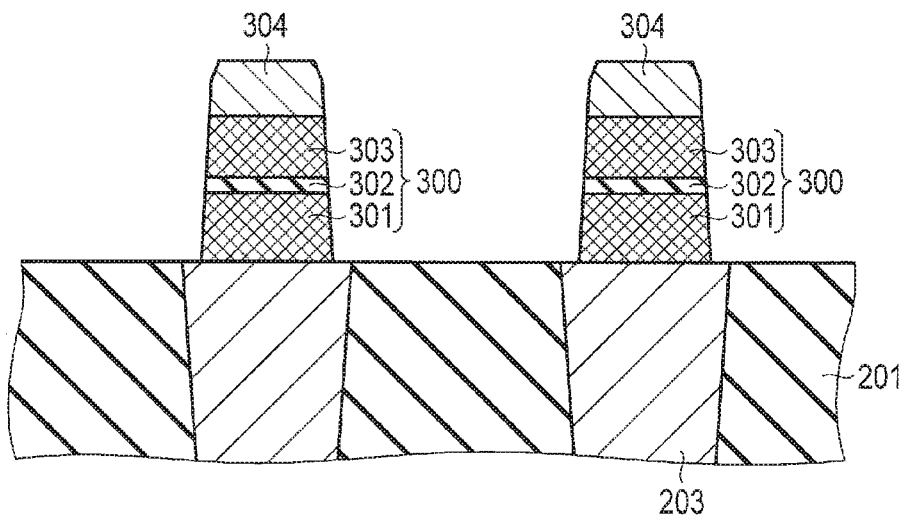

Next, as shown in FIG. 5C, a hard mask 304 is formed on the second magnetic layer 303. The diameter of the hard mask 304 is smaller than the diameter of the bottom electrode 203. Further, the hard mask 304 is provided in the bottom electrode 203 when viewed from above. Here, the positional relationship between the hard mask 304 and the bottom electrode 203 is not necessarily limited to the above. In some cases, a part of the hard mask 304 may be located outside of the bottom electrode 203.

Subsequently, by using the hard mask 304 as a mask and selectively etching the second magnetic layer 303, the tunnel barrier layer 302 and the first magnetic layer 301 using an IBE method, the MTJ element 300 is formed. It is possible to etch the MTJ element 300 easily since the MTJ element 300 does not comprise a thick shift-adjustment layer. That is, since there is no conductive film as a shift-adjustment layer to be etched in this process, the etching becomes accordingly easier as compared with the case of selectively etching an element pattern after forming a conductive film as a shift-adjustment layer on the laminated films 301 to 303.

Note that the above-described select etching of the respective layers 303 to 301 is preferably physical etching such as IBE so that the MTJ element 300 can be formed with excellent dimension controllability. As the gas for IBE, an inert gas such as Ar or He may be used. It is also possible to process the respective layers 303 to 301 by an RIE method.

Further, since the MTJ element 300 is provided on the flat upper surface of the bottom electrode 203, the MTJ element comprises layers 301 to 303 of excellent quality. Further, the MTJ element 300 comprises the layers 301 to 303 and corresponds to the MTJ element M of FIGS. 1 to 3.

Figure 5D:
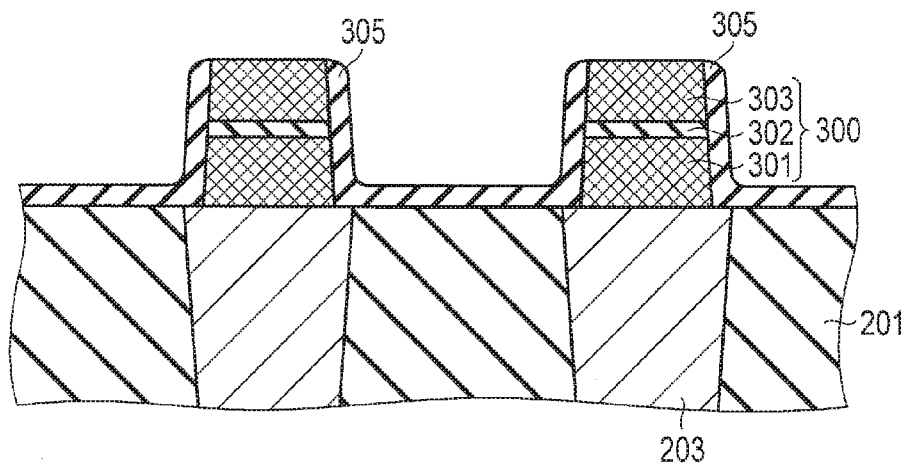

Next, as shown in FIG. 5D, a silicon nitride film 305 is formed on the side surfaces of the MTJ element 300 and on the interlayer insulating film 201 after the hard mask 304 is removed (here the hard mask removing is not inevitable). The silicon nitride film 305 is provided to prevent the MTJ element 30 from having the influence of oxygen. If there is little influence of oxygen, the silicon nitride film 305 is not necessarily required.

Next, as shown in FIG. 5E, the interlayer insulating film (second insulating film) 306 is formed on the silicon nitride film 305 in such a manner as to cover the MTJ element 300, and then a through-hole is formed in the interlayer insulating film 306 to reach the MTJ element 300. Subsequently, a contact plug 307 is formed by burying a conductive film in the through-hole. The contact plug 307 corresponds to the above-described top electrode TEC of FIGS. 1 to 3. The material similar to the bottom electrode 203 can be used for the contacting plug 307.

Although not shown in the drawings, a contact hole is formed in the interlayer insulating film 306 and the interlayer insulating film 201 similarly by using a damascene process to reach the other source/drain region 104 (S1) of the first transistor of FIG. 2 described above, and a contact plug 308 is buried in the contact hole. The contact plug 308 corresponds to the above-described plug SC of FIGS. 1 to 3.

Note that it is also possible by using a conductive material such as TiN, Ti, Ta or W as a material for the hard mask 304 to use the hard mask 304 also as the top electrode without removing it. In this case, after the MTJ element is etched by using the hard mask 304, the interlayer insulating film 306 is formed. In the case of using a nonconductive hard mask, it is also possible to remove the nonconductive hard mask when opening a contact hole for the contact plug 307. That is, the process of removing a hard mask varies from one case to another.

Next, as shown in FIG. 5F, a material for a bit line and a shift-adjustment layer, namely, a conductive film 400 is formed on the interlayer insulating film 306 and the top electrode 307. The conductive film 400 has an artificial lattice of, for example, alternately laminated Co and Pt. Subsequently, a mask 403 for processing into a BL pattern is formed on the conductive film 400.

Since the conductive film 400 needs to function as a BL interconnect as well as a shift-adjustment layer for the MTJ element, it is important to select a suitable material for the conductive film 400. Other than the above-described structure, an artificial lattice of alternately laminated Co and Pd may be used. Further, it is also possible to use an alloy of CoPt or an alloy of CoFe.

Subsequently, the conductive film 400 is selectively etched in the BL pattern by an IBE method using gaseous Ar or the like, and then the above-described structure of FIG. 4 is obtained. Note that not only an IBE method but also a damascene method may be used to form the shift-adjustment layer 401 in a case where an alloy of CoPt or an alloy of CoFe is used as the conductive film 400. Also normal RIE (reactive ion etching) is available.

According to the present embodiment, by forming a pattern on and selecting a material for the shift-adjustment layer 401, the shift-adjustment layer 401 having a function of the bit line BL can be obtained. In other words, a bit line BL having a function of a shift-adjustment layer can be obtained. Further, in this case, it is possible to process easily into the MTJ element 300 by an IBE method since there are only three layers 301 to 303 to be etched. Still further, since the shift-adjustment layer 401 which also functions as a bit line can be obtained separately from the MTJ element simply by etching the conductive film 400, it is possible to etch the shift-adjustment layer 401 easily by an IBE method.

From the above, even when the MTJ element 300 is miniaturized, it is possible to realize a device structure which achieves a sufficient shift-cancellation effect.

Second Embodiment

Figure 6:
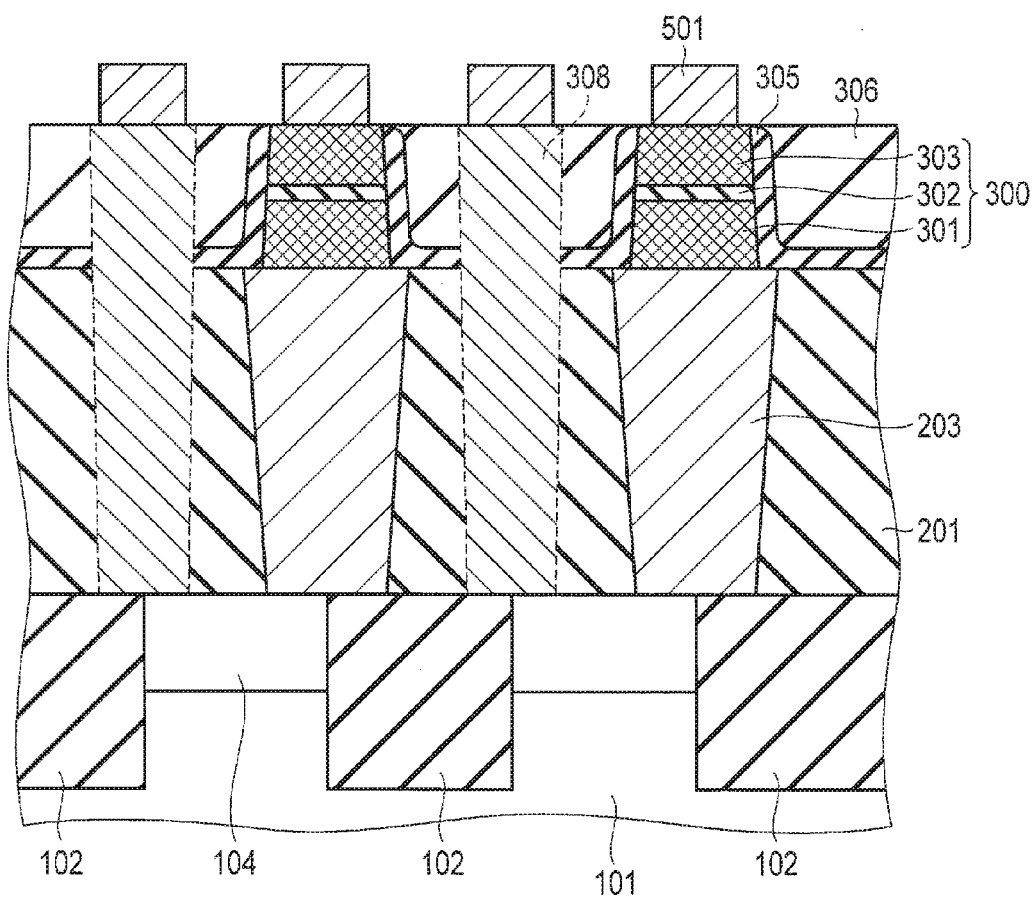
FIG. 6 is a cross-sectional diagram showing the general structure of a magnetoresistive memory device of a second embodiment.

FIG. 6 is a cross-sectional diagram showing the general structure of a magnetoresistive memory device of a second embodiment. Note that components the same as those of FIG. 4 are denoted by the same reference numbers and detailed descriptions thereof will be omitted.

The present embodiment is different from the above-described first embodiment in omitting the top electrode 307 provided for each MTJ element.

That is, on the second magnetic layer 303 of the MTJ element 300, a shift-adjustment layer 501 having an artificial lattice of alternately laminated Co and Pt is formed. The shift-adjustment layer 501 extends on the interlayer insulating film 306 in such a manner as to connect a plurality of those of the MTJ elements 300. Therefore, the shift-adjustment layer 501 has the function of a BL in addition to the functions of a top electrode and a shift-cancellation layer.

Also in the present embodiment, an effect similar to that produced in the first embodiment can be obtained since it is possible to process easily into the MTJ element 300 and into a bit line by an IBE method.

Figure 7:
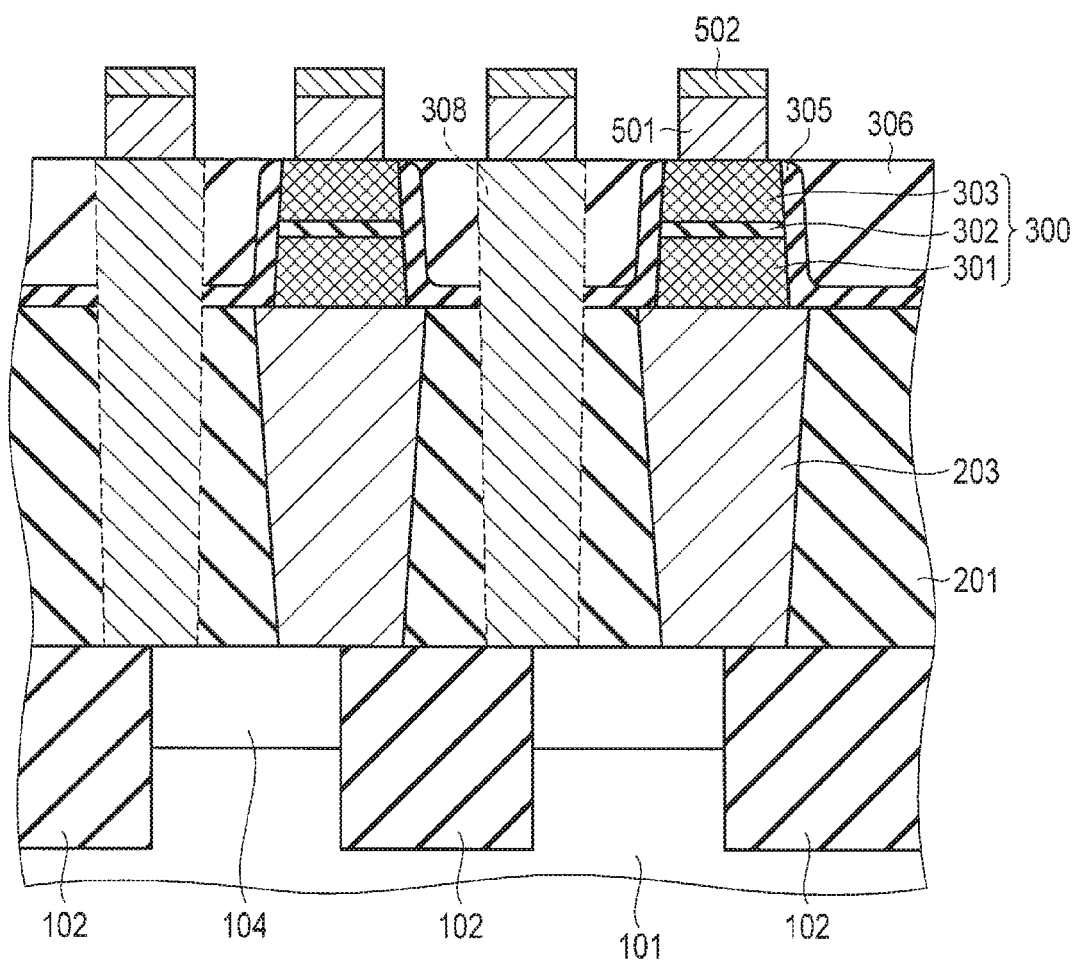
FIG. 7 is a cross-sectional diagram showing the general structure of a magnetoresistive memory device of a modified example of the second embodiment.
Figure 8:
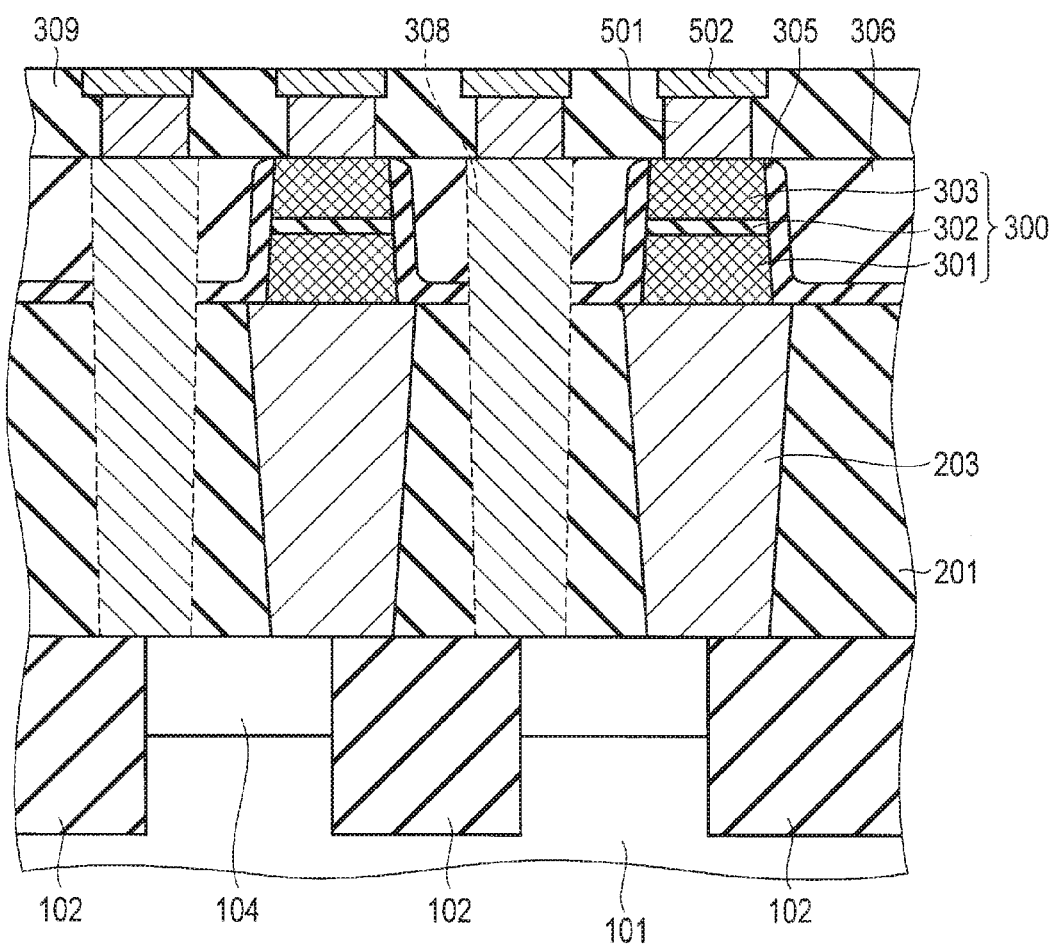
FIG. 8 is a cross-sectional diagram showing the general structure of a magnetoresistive memory device of another modified example of the second embodiment.

Note that it is also possible to provide an additional interconnect layer 502 of Cu or the like on the shift-adjustment layer 501 as shown in FIG. 7 if the resistance of the shift-adjustment layer 501 is not sufficiently low. Further, it is also possible to provide the additional interconnect layer 502 of Cu or the like by a damascene method or the like after forming an insulating film 306 as shown in FIG. 8. In this way, it is possible to achieve a shift-cancellation effect by the shift-adjustment layer 501 and realize a low resistance required for a bit line by the additional interconnect layer 502. It is possible to adopt the addition of an additional interconnect layer to the first embodiment as well.

Modified Example

Note that the present invention is not limited to each of the above-described embodiments.

The material of the shift-adjustment layer is not limited to an alloy or an artificial lattice of Co and Pt or Co and Fe, and any material can be used as long as the material sufficiently functions as a shift-adjustment layer and is sufficiently conductive as a bit line. In order to function as a shift-adjustment layer, the material only needs to include a first atom as a magnetic substance and a second atom having an orbital angular momentum greater than that of the first atom. The first atom may be cobalt (Co). The second atom may be platinum (Pt) or a rare-earth element. The rare-earth element may be terbium (Tb), holmium (Ho), dysprosium (Dy) or the like.

Further, the shift-adjustment layer is not necessarily configured to completely cancel the stray magnetic field from the reference layer and may be configured to suppress the stray magnetic field. Still further, the magnetoresistive element is not limited to an MTJ element and may be any element which has a resistance variable in accordance with the storage state.

Figure 9:
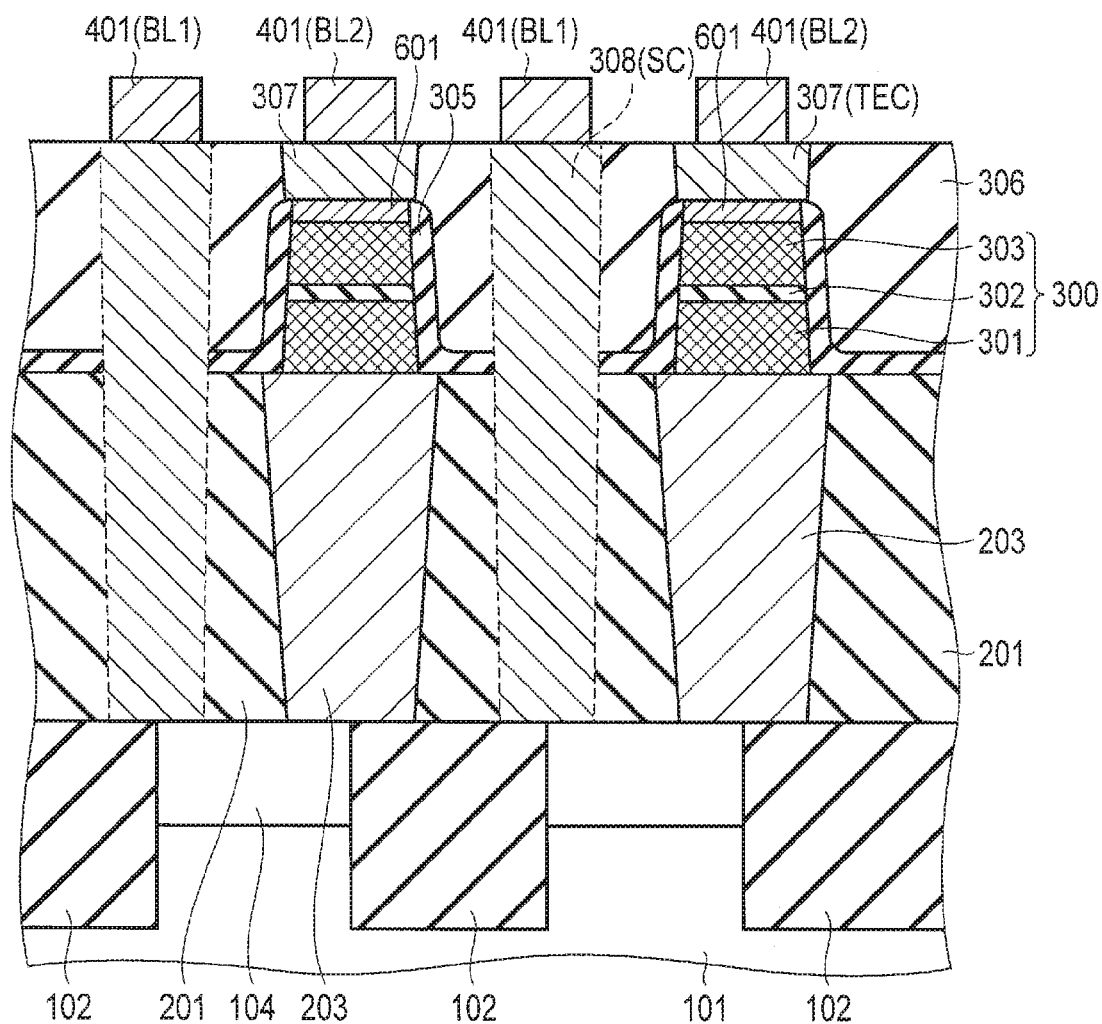
FIG. 9 is a cross-sectional diagram showing the general structure of a magnetoresistive memory device of a modified example.

Still further, although it has been assumed in the embodiments that the shift-adjustment layer is not included in the MTJ element, it is also possible to adopt the embodiments to a case where a part of the shift-adjustment layer is included in the MTJ element as shown in FIG. 9. That is, a supplementary shift-adjustment layer (magnetic layer) 601 may be provided above the MTJ element 300. In this case, the shift-adjustment layer in the MTJ element has a thickness thinner than that of a case where the shift-adjustment layer is entirely included in the MTJ element. Since there is no shift-adjustment layer having a considerable thickness to be processed in the MTJ processing using a hard mask, it is possible to process the MTJ element easily.

Still further, although the supplementary shift-adjustment layer 601 is applied to the first embodiment in FIG. 9, the supplementary shift-adjustment layer 601 is also applicable to the second embodiment in the same manner. Still further, it is also possible to provide the supplementary shift-adjustment layer 601 below the MTJ element 300 instead of above the MTJ element 300.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a plurality of bottom electrodes provided on a substrate;
a plurality of magnetoresistive elements each provided on a corresponding one of the plurality of bottom electrodes;
a plurality of contact plugs each provided on a corresponding one of the plurality of magnetoresistive elements;
an insulating film provided on sides of the plurality of bottom electrodes, the plurality of magnetoresistive elements and the plurality of contact plugs; and
a shift-adjustment layer provided on the plurality of contact plugs, the shift-adjustment layer extending on the insulating film to interconnect the plurality of contact plugs,
wherein the shift-adjustment layer has an artificial lattice of alternately laminated Co and Pt or an artificial lattice of alternately laminated Co and Pd, and the shift-adjustment layer suppresses a stray magnetic field in the plurality of magnetoresistive elements.

2. The device of claim 1, wherein the shift-adjustment layer contains one of Co, Fe and Ni.

3. The device of claim 1, wherein the shift-adjustment layer contains an alloy of CoPt or an alloy of CoFe.

4. The device of claim 1, wherein each of the plurality of magnetoresistive elements has a stacked layer structure including a first magnetic layer, a second magnetic layer and a nonmagnetic layer between the first and second magnetic layers.

5. The device of claim 1, wherein each of the plurality of magnetoresistive elements is an MTJ element which includes:
a first magnetic material layer,
a second magnetic material layer,
a nonmagnetic material layer between the first magnetic material layer and the second magnetic material layer, and
a third magnetic material layer on a side of the first magnetic material layer opposite to a side thereof interfacing the nonmagnetic material layer or on a side of the second magnetic material layer opposite to a side thereof interfacing the nonmagnetic material layer.

6. The device of claim 1, wherein a metal film is provided on the shift-adjustment layer.

7. The device of claim 6, wherein the metal film has a conductive rate higher than that of a material of the shift-adjustment layer.

8. The device of claim 1, wherein the insulating film comprises a first insulating film provided on the sides of the plurality of bottom electrodes, and a second insulating film provided on the sides of the plurality of magnetoresistive elements and the plurality of contact plugs.

9. The device of claim 8, wherein:
the first and second insulating films are oxide films, and
the device further comprises a nitride film provided between the first insulating film and the second insulating film and on side surfaces of the plurality of magnetoresistive elements.

10. A magnetoresistive memory device comprising:
a plurality of bottom electrodes provided on a substrate;
a plurality of magnetoresistive elements each provided on a corresponding one of the plurality of bottom electrodes;
an insulating film provided on sides of the plurality of bottom electrodes and the plurality of magnetoresistive elements; and
a shift-adjustment layer provided on the plurality of magnetoresistive elements, the shift-adjustment layer extending on the insulating film to interconnect the plurality of magnetoresistive elements,
wherein the shift-adjustment layer has an artificial lattice of alternately laminated Co and Pt or an artificial lattice of alternately laminated Co and Pd, and the shift-adjustment layer suppresses a stray magnetic field in the plurality of magnetoresistive elements.

11. The device of claim 10, wherein the shift-adjustment layer contains an alloy of CoPt or an alloy of CoFe.

12. The device of claim 10, wherein each of the plurality of magnetoresistive elements has a stacked layer structure including a first magnetic layer, a second magnetic layer and a nonmagnetic layer between the first and second magnetic layers.

13. The device of claim 10, wherein each of the plurality of magnetoresistive elements is an MTJ element which includes:
a first magnetic material layer,
a second magnetic material layer,
a nonmagnetic material layer between the first magnetic material layer and the second magnetic material layer, and
a third magnetic material layer on a side of the first magnetic material layer opposite to a side thereof interfacing the nonmagnetic material layer or on a side of the second magnetic material layer opposite to a side thereof interfacing the nonmagnetic material layer.

14. The device of claim 10, wherein a metal film is provided on the shift-adjustment layer.

* * * * *